US006621323B1

(12) United States Patent
Casper et al.

(10) Patent No.: US 6,621,323 B1
(45) Date of Patent: Sep. 16, 2003

(54) SIGNAL SAMPLING CIRCUITS, SYSTEMS, AND METHODS

(75) Inventors: Bryan K. Casper, Hillsboro, OR (US); Aaron K. Martin, Hillsboro, OR (US); Stephen R. Mooney, Beaverton, OR (US); James E. Jaussi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/131,443

(22) Filed: Apr. 24, 2002

(51) Int. Cl.[7] ............................................... H03K 17/30
(52) U.S. Cl. ..................... 327/379; 327/387; 326/26; 326/30; 326/86
(58) Field of Search ............................... 327/108, 109, 327/379, 386, 387; 326/21, 26, 27, 28, 30, 82, 83, 86

(56) References Cited

U.S. PATENT DOCUMENTS

| 5,793,223 A | * | 8/1998 | Frankeny | ...................... 326/30 |
| 6,127,849 A | * | 10/2000 | Walker | ......................... 326/86 |
| 6,496,058 B1 | * | 12/2002 | Hong | .......................... 327/565 |

\* cited by examiner

*Primary Examiner*—Tuan T. Lam
(74) *Attorney, Agent, or Firm*—Schwegman, Lundberg, Woessner & Kluth, P.A.

(57) ABSTRACT

A circuit samples a voltage on a simultaneous bi-directional bus, and subtracts an outbound voltage to determine an inbound voltage. Sampling capacitors are variable to adjust for matching time constants. A mechanism is provided to sample error voltages over clock phase variations and sampling capacitor values.

29 Claims, 9 Drawing Sheets

SIGNAL SAMPLING CIRCUITS, SYSTEMS, AND METHODS

FIELD

This document pertains in general to systems that sample signals, and in particular to systems that sample and compare multiple signals.

BACKGROUND

Integrated circuits typically communicate with other integrated circuits on wires that are part of a "bus." A typical bus includes many wires, or circuit board traces, connecting multiple integrated circuits. Some buses are "unidirectional," because signals only travel in one direction on each wire of the bus. Other buses are "bi-directional," because signals travel in more than one direction on each wire of the bus. In the past, most bi-directional buses were not "simultaneously bi-directional," because multiple signals did not travel on the same wire in opposite directions at the same time; instead, the bus was shared over time, and different signals traveled in different directions at different points in time. Some newer buses are "simultaneous bi-directional" buses. Simultaneous bi-directional buses allow data to travel in two directions on a single wire at the same time.

Receivers coupled to simultaneous bi-directional buses receive signals that include multiple components. For example, a receiver may intend to receive a signal transmitted from a driver on an opposite end of a bus, but the signal actually received is the superposition of the signal transmitted from the opposite end, and a near-end signal driven by a driver that is paired with the receiver on the near-end of the bus. In order for the receiver to receive the intended signal, the received signal is typically sampled, and the near-end signal is subtracted from the sampled signal.

For the reasons stated above, and for other reasons stated below which will become apparent to those skilled in the art upon reading and understanding the present specification, there is a need in the art for a method and apparatus to provide signal sampling and subtraction mechanisms.

DESCRIPTION OF EMBODIMENTS

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Figure 1:
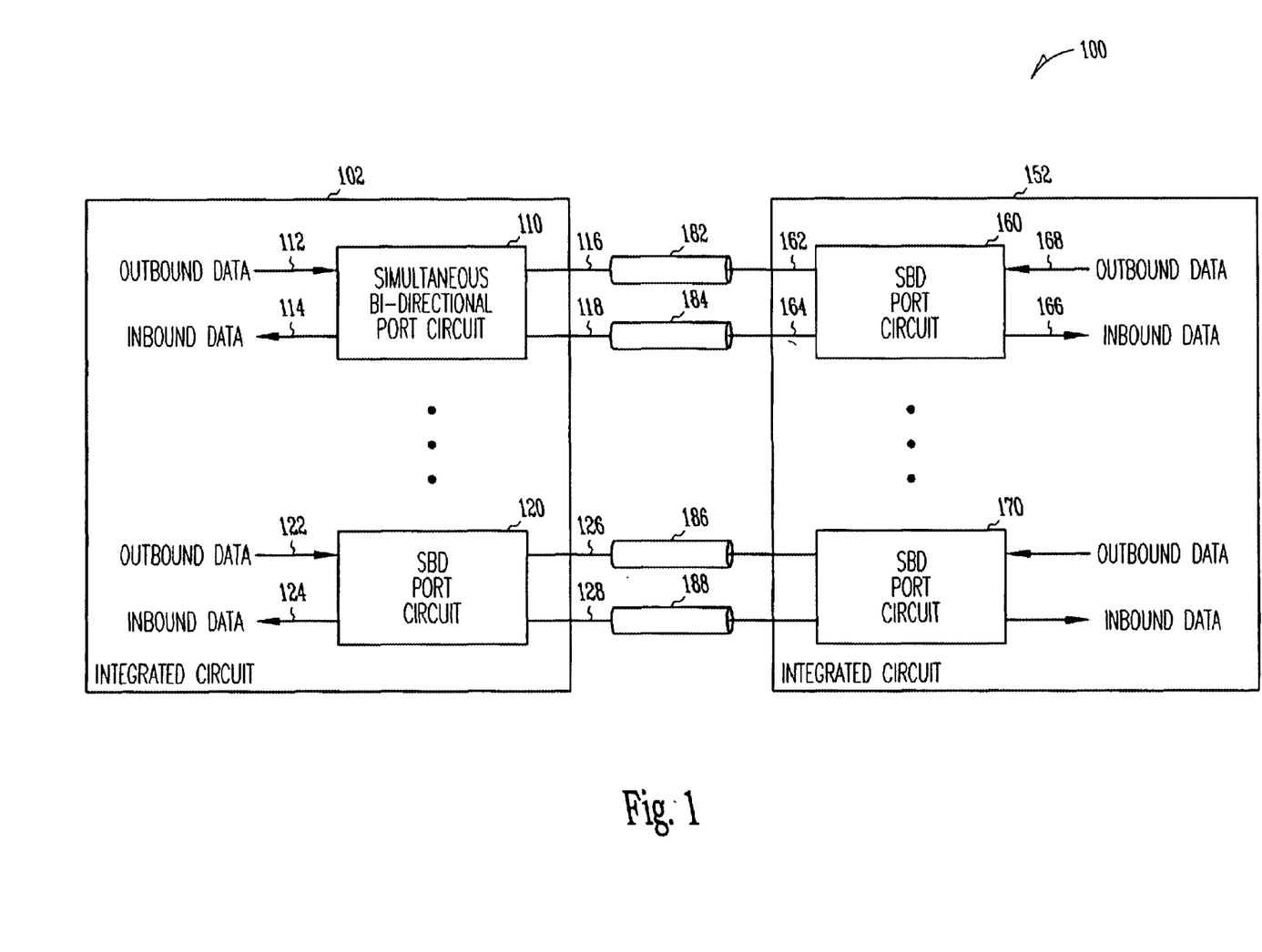
FIG. 1 shows a block diagram of a system with two integrated circuits coupled by simultaneous bi-directional port circuits.

FIG. 1 shows a block diagram of a system with two integrated circuits coupled by simultaneous bi-directional port circuits. System 100 includes integrated circuits 102 and 152, and transmission lines 182, 184, 186, and 188. Integrated circuit 102 includes simultaneous bi-directional (SBD) port circuits 110 and 120. Integrated circuit 152 includes SBD port circuits 160 and 170. Simultaneous bi-directional port circuit 110 communicates with SBD port circuit 160 using transmission lines 182 and 184. Within integrated circuit 102, SBD port circuit 110 communicates using nodes 112 and 114. For example, SBD port circuit 110 receives data on node 112 from other circuits within integrated circuit 102, and transmits data on node 114 to other circuits within integrated circuit 102. When SBD port circuit 110 receives data on node 112, this data is transmitted outside integrated circuit 102 using interface nodes 116 and 118. Interface nodes 116 and 118 correspond to external connections on integrated circuit 102. In some embodiments, interface nodes 116 and 118 correspond to pins or solder balls on a packaged integrated circuit. In other embodiments, interface nodes 116 and 118 correspond to pads on a packaged integrated circuit die.

Transmission lines 182 and 184 form a simultaneous bi-directional data link between SBD port circuit 110 and SBD port circuit 160. Likewise, transmission lines 186 and 188 form a simultaneous bi-directional data link between SBD port circuits 120 and 170

Interface nodes 116 and 118 are coupled to transmission lines 182 and 184, respectively. These transmission lines are also connected to SBD port circuit 160 within integrated circuit 152. In embodiments represented by FIG. 1, two transmission lines are used to couple each pair of SBD port circuits to allow for differential signaling. For example, when SBD port circuit 110 transmits a logical '1' on the simultaneous bi-directional data link, a high voltage may be driven on transmission line 182 and a low voltage may be driven on transmission line 184. In other embodiments, single-ended signaling is performed, and one of transmission lines 182 and 184 is omitted.

Simultaneous bi-directional port circuits 110 and 160 can both drive data on the simultaneous bi-directional link at the same time. As a result, voltage levels present on transmission lines 182 and 184 represent the superposition of the voltages driven by both SBD port circuits 110 and 160. Each of the SBD port circuits samples the voltages present on the transmission lines, and then subtracts the voltage representing outbound data driven by that port circuit to determine the voltage value driven by the port circuit on the other side of the link. For example, SBD port circuit 160 samples the voltage values on nodes 162 and 164, and then subtracts voltages corresponding to the data value on node 168 to arrive at the data value to be transmitted on node 166. This sampling and subtraction is described in more detail with reference to the following figures.

Each of integrated circuits 102 and 152 show two SBD port circuits. In some embodiments, each integrated circuit only includes a single SBD port circuit. In other embodiments, more than two SBD port circuits are included.

Figure 2:
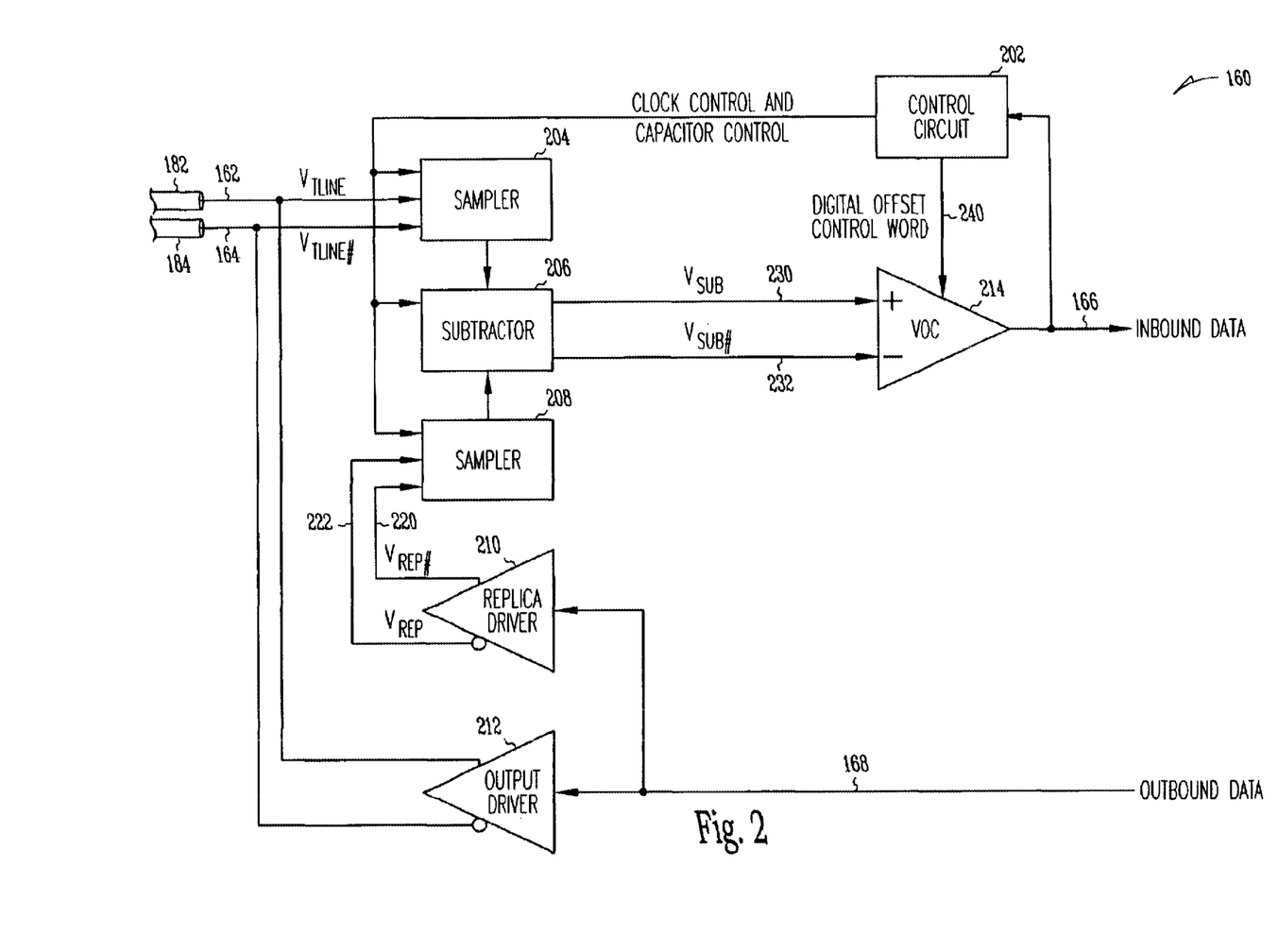
FIG. 2 shows a diagram of a simultaneous bi-directional port circuit.

FIG. 2 shows a diagram of a simultaneous bi-directional port circuit. Simultaneous bi-directional port circuit 160 includes variable offset comparator (VOC) 214 to produce inbound data on node 166, and also includes output driver 212 to drive outbound data from node 168. Simultaneous bi-directional port circuit 160 also includes samplers 204 and 208, subtractor 206, replica driver 210, and control circuit 2022. Output driver 212 receives outbound data on node 168 and drives input/output (I/O) nodes 162 and 164 with a differential output signal. Replica driver 210 also receives outbound data on node 168. Replica driver 210 drives the outbound data on differential nodes 220 and 222, which are input to sampler 208. As described more fully below, sampler 208 samples the voltages ($V_{REP}$, $V_{REP\#}$) driven on nodes to 220 and 222 by replica driver 210. Sampler 204 receives the voltages present on nodes 162 and 164. Subtractor 206 subtracts the voltages sampled by samplers 204 and 208. The resulting voltages ($V_{SUB}$, $V_{SUB\#}$) are delivered to variable offset comparator 214 on nodes 230 and 232.

Variable offset comparator 214 receives a differential analog signal on nodes 230 and 232, and outputs a digital signal on node 166. Variable offset comparator 214 also receives a digital offset control word provided by control circuit 202 on node 240. The digital offset control word controls a variable offset within variable offset comparator 214 to determine the input voltages at which the output of variable offset comparator 214 changes state. For example, when a zero offset is specified by the digital offset control word, variable offset comparator 214 will change state when the input voltages are equal. When a non-zero offset is specified, the output of variable offset comparator 214 will change state when the input voltages are something other than equal. The digital offset control word can include any number of bits. To accommodate any number of bits, node 240 can be any number of physical lines.

Control circuit 202 controls clocks and capacitors within samplers 204 and 208, and subtractor 206. Control circuit 202 also produces the digital offset control word on node 240. As explained more fully below, control circuit 202 can modify clock signals and capacitor values and the digital offset control word to determine appropriate capacitor values within the sampler circuits, and to determine an appropriate digital offset control word value on node 240.

In some embodiments, control circuit 202 is a dedicated state machine built in hardware. In some of these embodiments, control circuit 202 runs a state machine process during an initialization time. In other of these embodiments, control circuit 202 runs a state machine process periodically to determine proper capacitor values and digital offset control word values. In other embodiments, control circuit 202 is a microprocessor or other high-level processing mechanism capable of sensing an inbound data value on node 166 and capable of driving clock control signals, capacitor control signals, and the digital offset control word. In some embodiments, control circuit 202 is a processor interface that is coupled to an external bus, which is in turn coupled to a microprocessor.

Figure 3:
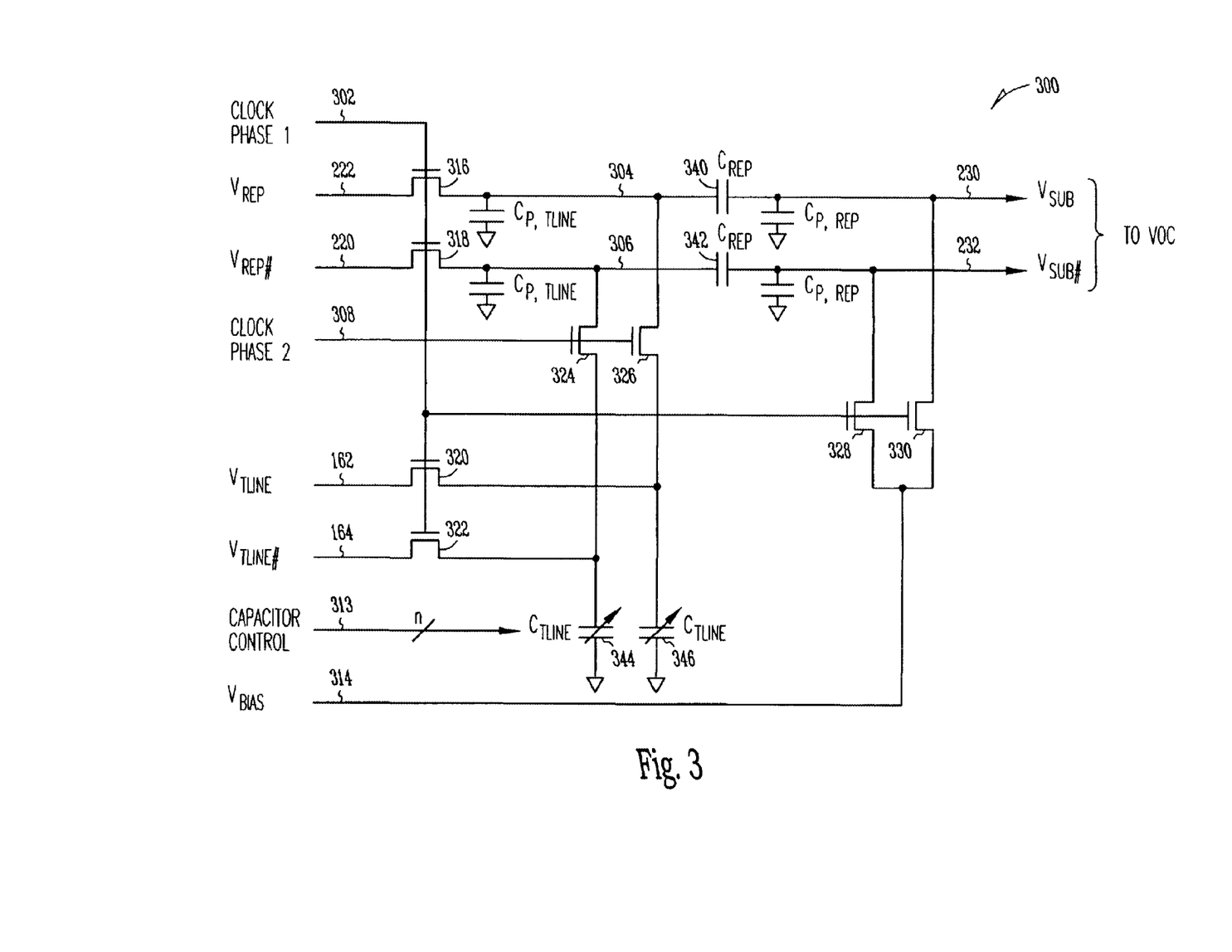
FIG. 3 shows a schematic of a sampling and subtraction circuit.

FIG. 3 shows a schematic of a sampling and subtraction circuit. Sampling and subtraction circuit 300 corresponds to the combination of samplers 204 and 208, and subtractor 206 (FIG. 2). Sampling and subtraction circuit 300 includes sampling capacitors 340 and 342 ($C_{REP}$), sampling capacitors 344 and 346 ($C_{TLINE}$), and switching transistors 316, 318, 320, 322, 324, 326, 328, and 330. The switching transistors are shown in FIG. 3 as n-channel transistors, however any type of switching mechanism can be used. Also shown in FIG. 3 are parasitic capacitances $C_{P,TLINE}$ and $C_{P,REP}$. The parasitic capacitance values have an impact on the performance of sampling and subtraction circuit 300 as explained further with reference to the equations below.

Transistors 316 and 318 conditionally couple $V_{REP}$ and $V_{REP\#}$ on nodes 222 and 220 to sampling capacitors 340 and 342, respectively, based on the signal level of the "clock phase 1" signal on node 302. Also based on the signal level of the clock phase 1 signal, transistors 320 and 322 conditionally couple $V_{TLINE}$ and $V_{TLINE\#}$ on nodes 162 and 164 to sampling capacitors 346 and 344, respectively. Transistor 324 conditionally couples sampling capacitors 342 and 344, and transistor 326 conditionally couples sampling capacitors 340 and 346, based on the signal level of the "clock phase 2" signal on node 308. Transistors 328 and 330 are included to bias nodes 230 and 232 to a common bias voltage present on node 314 when the sampling capacitors are sampling the input voltages on nodes 222, 220, 162, and 164.

In operation, the sampling capacitors sample the voltages on the input nodes when the clock phase 1 signal on node 302 turns on transistors 316, 318, 320, and 322. The sampling capacitors are then isolated from the input nodes when the signal level of the clock phase 1 signal transitions to turn off transistors 316, 318, 320, and 322. The clock phase 2 signal on node 308 is then asserted to couple the sampling capacitors in a charge-sharing arrangement. For example, sampling capacitor 344 shares charge with sampling capacitor 342, and sampling capacitor 346 shares charge with sampling capacitor 340. The differential voltage present on nodes 304 and 306 represents the difference between the differential voltages originally sampled by the sampling capacitors.

The clock phase 1 signal, clock phase 2 signal, and the capacitor control signal on node 313 correspond to the clock control and capacitor control output from control circuit 202 (FIG. 2). Control circuit 202 can advance or retard the timing of the clock signals, and can also change the capacitance value of sampling capacitors 344 and 346. This is useful to find suitable capacitance values for sampling capacitors 344 and 346, as is discussed further below.

The differential voltage output from sampling and subtraction circuit 300 is present on nodes 230 and 232. The voltages on nodes 230 and 232 are shown as $V_{SUB}$ and $V_{SUB\#}$, respectively, in FIG. 3. Ideal outbound-from-inbound subtraction only occurs if the parasitic capacitances to ground (switching transistor diffusion capacitance, VOC input gate capacitance, etc.) are infinitely small. Otherwise, there will be attenuation and/or errors in the final subtracted voltage. With non-ideal subtraction, the resulting differential output voltage is shown in eq (1):

$$V_{SUB}-V_{SUB\#}=\alpha[(V_{TLINE}-V_{TLINE\#})-\beta(V_{REP}-V_{REP\#})] \quad \text{Eq. (1)}$$

where $\alpha$ is an attenuation term and $\beta$ is an asymmetric error term. When both $\alpha$ and $\beta$ are forced to unity, the differential output voltage is the difference between the differential input voltages without any attenuation or error. β can be forced to unity (neglecting clock feed through) by matching all the parasitic capacitances between the differential lines. If β is forced to unity, the asymmetric error disappears, and the symmetric attenuation is given by eq. (2) as:

$$\alpha = \frac{C_{TLINE} C_{REP}}{[C_{TLINE} + C_{P,TLINE}][C_{REP} + C_{P,REP}] + C_{REP} C_{P,REP}} \quad \text{Eq. (2)}$$

By increasing the size of the sampling capacitors ($C_{REP}$, $C_{TLINE}$) or by decreasing the size of the parasitic capacitances ($C_{P,REP}$, $C_{P,TLINE}$), α can be kept close to unity. Increasing the size of the sampling capacitors increases the associated time constants and reduces the bandwidth of the system. Decreasing the size of the parasitic capacitances can be accomplished by reducing the size of the transistors sharing nodes with the sampling capacitors. For example, if transistors 316 and 326 are kept small, the parasitic capacitance coupled to sampling capacitor 340 can be reduced.

As shown and described with reference to FIG. 2 above, nodes 162 and 164 are each coupled to a transmission line, and are also driven by an output driver. In contrast, nodes 222 and 220 are only coupled to, and driven by, a replica driver. The impedances on nodes 222 and 220 in combination with the capacitance values of sampling capacitors 340 and 342 result in time constants that govern how fast the capacitors can sample the input voltages. A different time constant is created by the combination of impedances on nodes 162 and 164 and the capacitance values of sampling capacitors 346 and 344. Performance of circuit 300 can be improved when these time constants match. Because the impedances on the input nodes may be different, the time constants can be substantially matched by varying the value of sampling capacitors 344 and 346. As shown in FIG. 3, sampling capacitors 344 and 346 are variable capacitors controlled by the capacitor control signal on node 313.

In some embodiments, each sampling capacitor 344 and 346 is implemented with multiple smaller capacitors, each selectable with a switch. For example, smaller capacitors can be coupled in series with switches, and then multiples of the capacitor/switch combinations can be coupled in parallel. Each switch includes a control node coupled to one bit of the capacitor control word on node 313. The capacitors can be sized with any relationship relative to each other. For example, each smaller capacitor can be the same size, or can be sized in a binary fashion relative to others.

Figure 4:
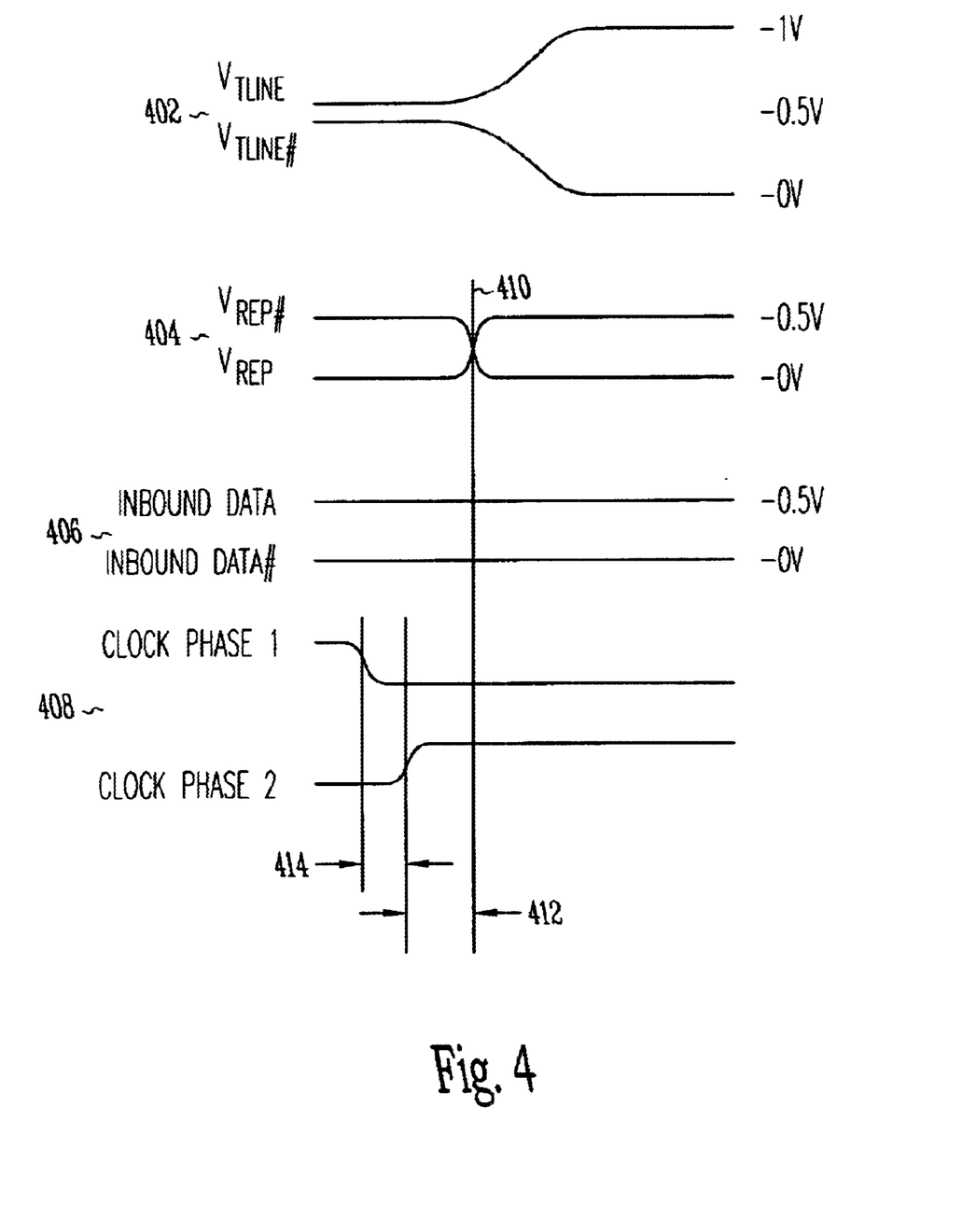
FIG. 4 shows a timing diagram for the operation of the circuit of FIG. 3.

FIG. 4 shows a timing diagram for the operation of the circuit of FIG. 3. Waveforms 402 represent voltages ($V_{TLINE}$, $V_{TLINE\#}$) changing on the transmission lines coupled to nodes 162 and 164 (FIG. 2). Likewise, waveforms 404 represent voltages ($V_{REP}$, $V_{REP\#}$) changing on the replica driver outputs on nodes 222 and 220. As shown in FIG. 4, the outbound data (represented by waveforms 404) causes the transmission line voltages (waveforms 402) to change. The data transmitted by the other side of the link (waveforms 406) are included in FIG. 4 to show that the inbound data is not changing during the time represented by FIG. 4.

Waveforms 408 show one possible relationship 414 between the clock phase 1 signal and the clock phase 2 signal. The clock phase 1 signal transitions high to low to isolate the sampling capacitors from the input nodes, and then the clock phase 2 signal transitions high to couple the sampling capacitors in a charge-sharing arrangement as previously described. In some embodiments, the clock phase 2 signal is generated by delaying and inverting the clock phase 1 signal with a single inverter.

Waveforms 404 transition at a time determined by a "driver clock phase." The clock driver phase determines the time at which output driver 212 and replica driver 210 (FIG. 2) transition. This is shown at 410 in FIG. 4. The time at which the clock phase 1 signal and the clock phase 2 signal transition is referred to as the receiver clock phase. Control circuit 202 (FIG. 2) can control the receiver clock phase relative to the driver clock phase. As the receiver clock phase is changed, the transitions of the clock phase 1 signal and clock phase 2 signal move left and right relative to the transition shown in waveforms 402 and 404.

Figure 5:
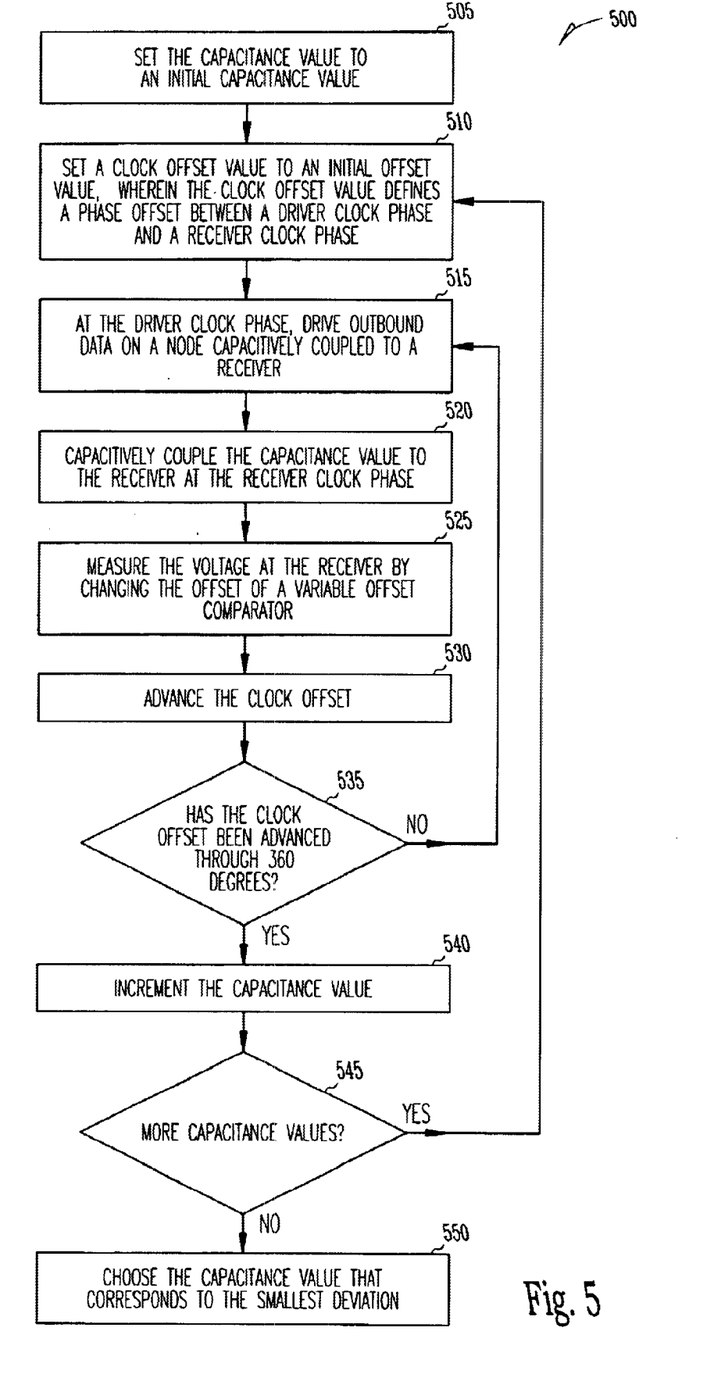
FIG. 5 shows a flowchart of a method for determining a capacitance value.

FIG. 5 shows a flowchart of a method for determining a capacitance value for a sampling capacitor. In some embodiments, method 500 is performed by a dedicated control circuit such as control circuit 202 (FIG. 2). In other embodiments, method 500 is performed by a processor, and in still other embodiments, the performance of method 500 is distributed across multiple control circuits or processors. The various actions shown in FIG. 5 may be performed in an order other than that shown, and in some embodiments, some actions are omitted from method 500. When method 500 is complete, the capacitor control word on node 313 is set, and the capacitance values of capacitors 344 and 346 are likewise set.

The capacitance value is set to an initial capacitance value as shown at block 505. This corresponds to the capacitor control word on node 313 being set to an initial value. As shown in block 510, a clock offset value is set to an initial offset value, where the clock offset value defines a phase offset between a driver clock phase and a receiver clock phase. For example, referring now back to FIG. 4, the driver clock phase is shown by the transition of the replica driver output waveforms at 410, and the clock offset value is shown at 412. Continuing with the discussion of FIG. 5, at block 515, outbound data is driven at the driver clock phase onto a node capacitively coupled to a receiver. This corresponds to output driver 212 (FIG. 2) driving nodes 162 and 164 with data. Nodes 162 and 164 are capacitively coupled to variable offset comparator 214 by sampling capacitors 340 and 342 (FIG. 3). The outbound data being driven at the driver clock phase is also shown in FIG. 4 by the transitions shown in waveforms 402 and 404.

At block 520, the capacitance value referred to in block 505 is capacitively coupled to the receiver at the receiver clock phase. In the embodiments represented by FIG. 3, this corresponds to transistors 324 and 326 turning on to couple capacitors 344 and 342, and to couple transistors 346 and 340. At block 525, the voltage at the receiver is measured by changing the offset of a variable offset comparator. For example, referring now to FIG. 2, control circuit 202 can vary the digital offset control word on node 240 to determine the voltage at the receiver. When the inbound data changes, the current offset value corresponds to the voltage at the receiver.

At block 530, the clock offset is advanced such that the location of the transitions of the clock phase signals shown in FIGS. 3 and 4 are different relative to the driver clock phase. Then, at decision block 535, a determination is made as to whether the clock offset has been advanced through 360 degrees. If the clock offset has not been advanced through 360 degrees, method 500 repeats the actions of blocks 515, 520, 525, and 530. Blocks 515, 520, 525, and 530 form an "inner loop" in method 500 that measures the receiver input voltage at every available clock offset for a given capacitance value. This inner loop generates one of the many curves shown in FIG. 6, which are discussed below.

If the clock offset has been advanced through 360 degrees, then method 500 continues with block 540, where the capacitance value is incremented. Decision block 545 determines whether the inner loop has been completed for each possible capacitance value, or if there are more capacitance values left. If there are more left, the "outer loop" is repeated starting at block 510. If there are no more capacitor values, then the appropriate capacitance value is chosen as the value that resulted in the smallest deviation. This is discussed more fully below with reference to FIG. 6.

Figure 6:
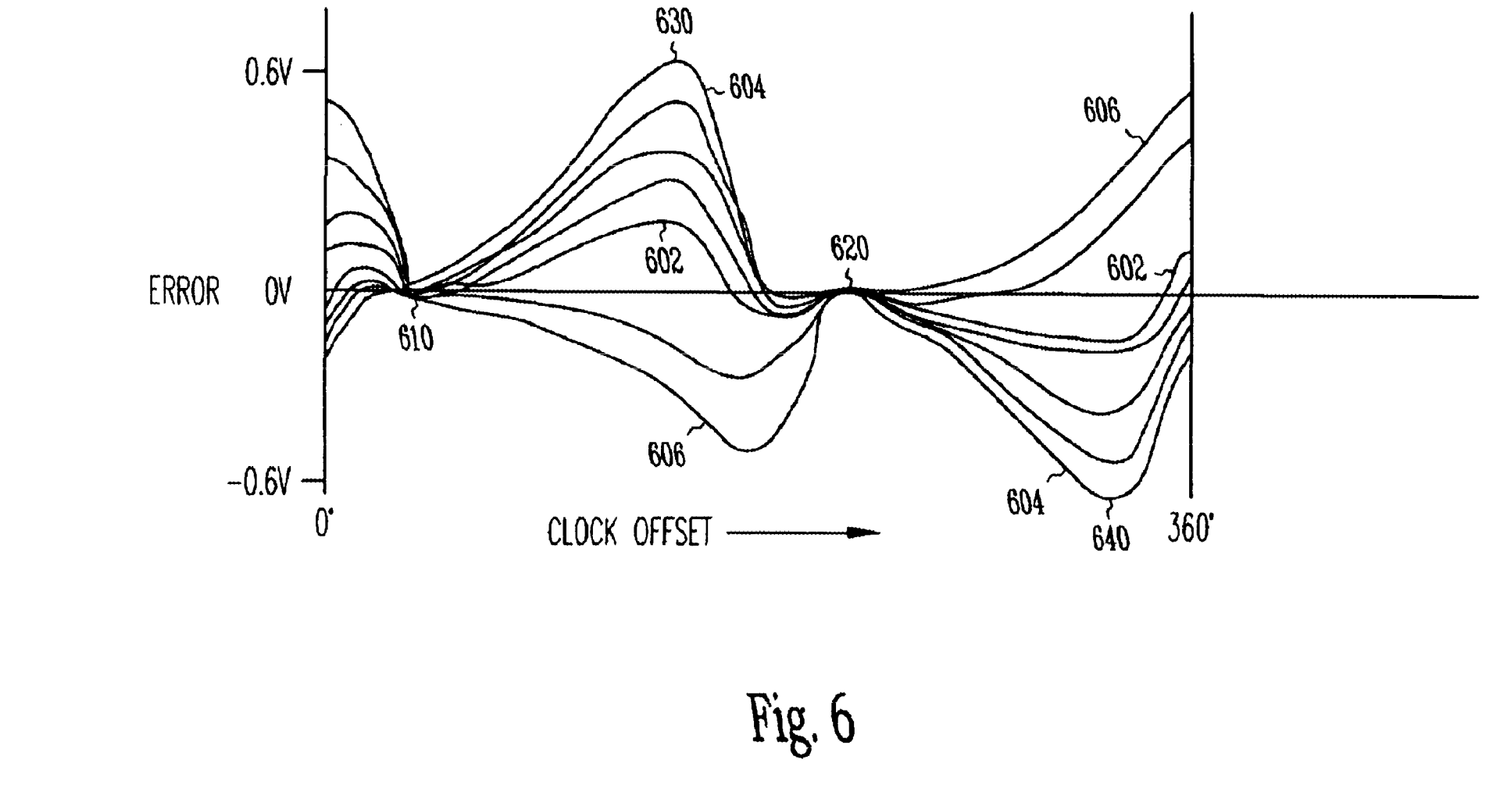
FIG. 6 shows a chart of voltage curves in accordance with the method of FIG. 5.

FIG. 6 shows a chart of voltage curves in accordance with the method of FIG. 5. As described with reference to the previous figure, each traversal of the inner loop of method 500 produces one of the curves shown in FIG. 6. For example, curve 604 is generated by one traversal of the inner loop, as are curves 602 and 606. As shown in FIG. 6, the inner loop of method 500 has been completed for seven different capacitance values. The capacitance value corresponding to curve 602 has resulted in the smallest error, or "deviation," and is chosen as the appropriate capacitance value in block 550 (FIG. 5).

The curves shown in FIG. 6 converge to near zero at two points shown as 610 and 620. Points 610 and 620 correspond to clock offsets where the receiver clock causes the sampling of the input voltages when they are substantially constant. In contrast, points 630 and 640 correspond to clock offsets where the receiver clock roughly corresponds to the driver clock, so that the input voltages are sampled while they are changing. In some embodiments, this information is also used to determine an appropriate clock offset value.

Figure 7:
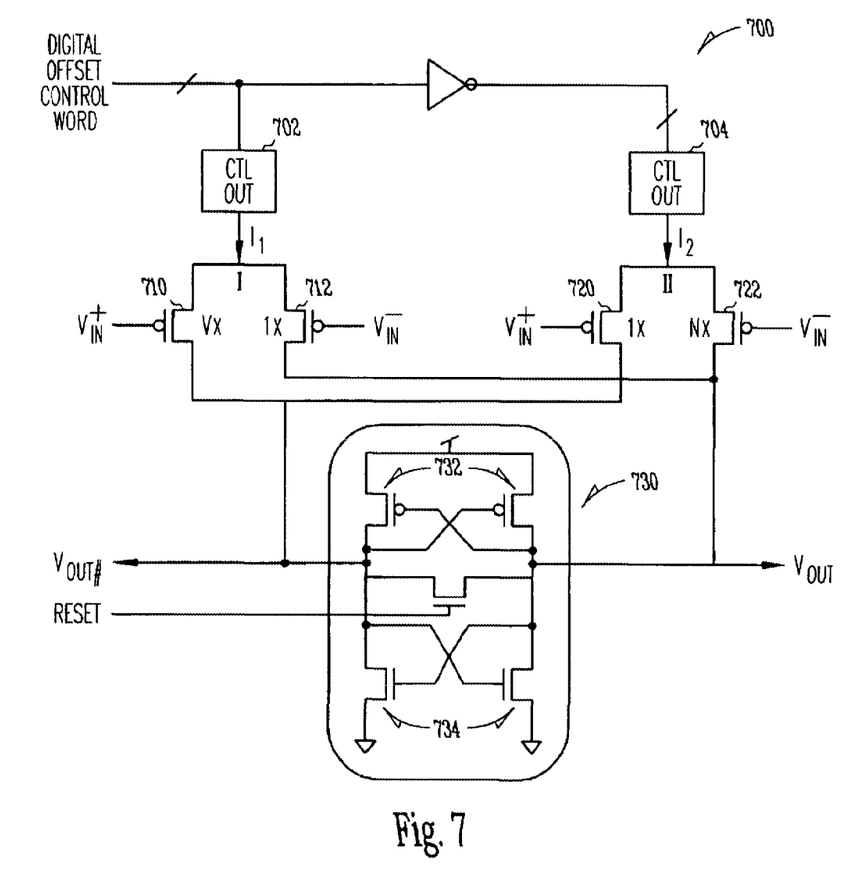
FIG. 7 depicts a circuit schematic of an embodiment of a variable offset comparator.

FIG. 7 depicts a circuit schematic of an embodiment of a variable offset comparator (VOC) for use as VOC 214 (FIG. 2). VOC 700 includes an amplifier circuit including first and second differential pairs which are defined by transistors 710, 712, and 720, 722, respectively. Variable current generators 702 and 704 are also coupled to control the tail currents $I_1$ and $I_2$ to the respective differential pairs. Current generators 702 and 704 are controlled by the digital offset control word (see FIG. 2) that is received on multiple signal nodes as shown. In this embodiment, each digital value of the offset control word corresponds to two oppositely varying tail currents $I_1$ and $I_2$ that are substantially equidistant from a nominal tail current. In some embodiments, variable current generators 702 and 704 are implemented using a plurality of current sources connected in parallel, with each of the current sources controlled by one of the bits in the offset control word. Transistors can be sized within variable current generators 702 and 704 so that a binary offset control word controls the variable current in a binary fashion, or so that the current varies linearly with the number of bits set to a logical '1' in the offset control word.

A single ended output voltage for this comparator may be available as either $V_{out}$ or $V_{out}\#$. To drive these output signals into one of two possible stable states, a regenerative load circuit 730 is provided as shown. After being reset by an input signal, this regenerative load circuit 730 quickly amplifies any difference between $V_{out}$ and $V_{out}$190 , where such amplification occurs at a relatively high gain due to the cross coupled n-channel pair 734 and p-channel pair 732, thereby ensuring that the output signals $V_{out}$ and $V_{out}\#$ only assume one of two possible stable states. Thus, if $V_{in}^+$ is greater than $V_{in}^-$ by at least the amount of offset that has been selected (as referred back to the input of the differential pairs), then the regenerative latch circuit 730 forcefully drives $V_{out}$ to a low voltage level and simultaneously drives $V_{out}\#$ to a high voltage level. Other types of regenerative latch circuits may be used to provide the digital type output signal typically associated with a sense amplifier or a comparator application.

Figure 8:
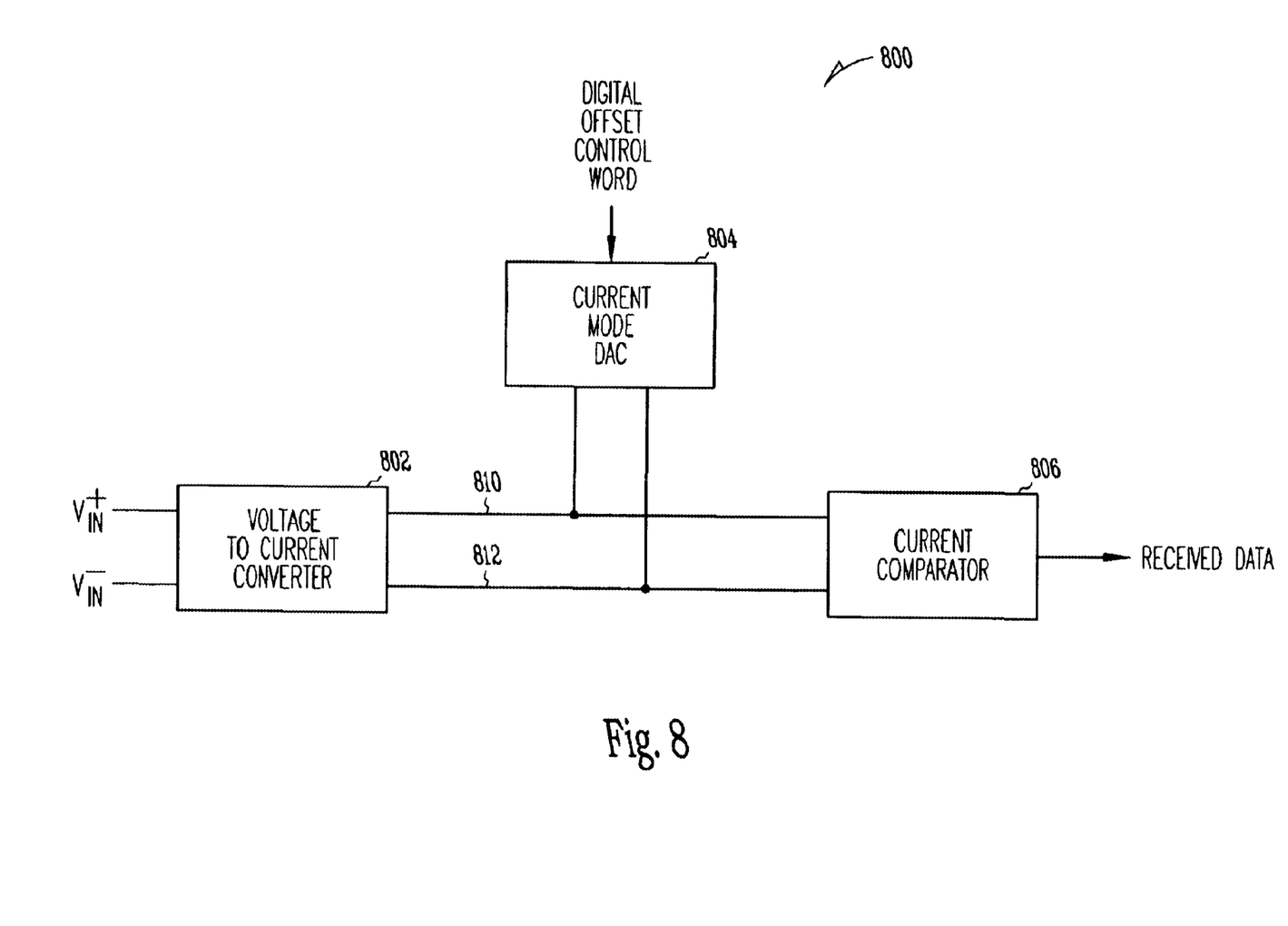
FIG. 8 shows a block diagram of another embodiment of a variable offset comparator.

FIG. 8 shows a block diagram of another embodiment of a variable offset comparator (VOC). VOC 800 includes voltage-to-current converter 802, current mode digital-to-analog (DAC) converter 804, and current comparator 806. Voltage to current converter 802 receives analog input voltages $V_{in}^+$ and $V_{in}^-$ and produces a differential current on current summing nodes 810 and 812. Current mode DAC 804 receives the digital offset control word and produces a differential current that varies as a function thereof The currents output from voltage-to-current converter 802 and current mode DAC 804 sum on nodes 810 and 812, and are input to comparator 806. Comparator 806 compares the currents on the current summing nodes and produces a digital output.

Figure 9:
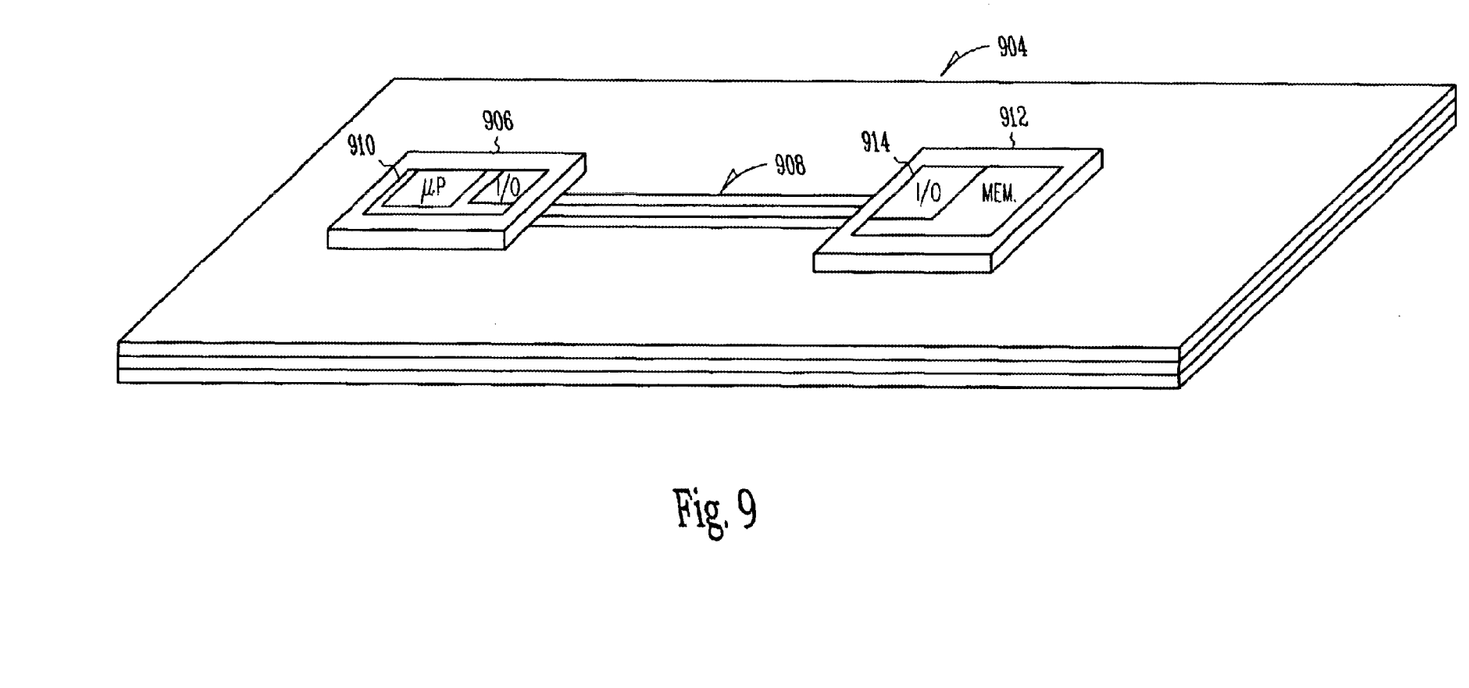
FIG. 9 shows a block diagram of an embodiment of an electronic system that includes simultaneous bi-directional port circuits.

FIG. 9 depicts a block diagram of an embodiment of an electronic system that includes SBD port circuits. The system has a multi-layer printed wiring board 904 upon which a parallel bus 908 is formed. The bus 908 may be of the point to point variety, or a multi-drop bus such as those used in a main memory. An integrated circuit (IC) chip package 906 is operatively installed on the board to communicate using the parallel bus 908. The installation of the package 906 may be done by a surface mount technique or via a connector or socket. The package has an IC chip 910 that includes a logic function section, and an I/O section as an interface between the logic function section and the bus 908. The logic function section may be of any type. For example, in some embodiments, the logic function may be a microprocessor, a memory controller, or a bus bridge. Alternatively, other devices that can be implemented in the logic function section of an IC chip may be used. The I/O section includes SBD port circuit such as those described above.

A second IC package 912 is also installed on the board 904 to communicate with the first package 906 via the bus 908. The second IC package 912 also includes a chip 914 having an I/O section in which a bus receiver is provided to interface the bus 908, and its own logic function section (here shown as a memory controller).

According to an embodiment, the I/O interfaces of the two chips 910 and 914 communicate with each other bi-directionally, that is using the same conductive lines of the bus for both transmitting and receiving data. Thus, in such an embodiment, drivers are provided, in both IC chips, that are connected to the same conductive lines of the bus 908. Other system applications of the simultaneous bi-directional port circuits are possible, including, for example, a cable receiver.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A simultaneous bi-directional port comprising:
 a driver having an output node coupled to an input/output node of the simultaneous bi-directional port;
 a replica driver; and
 a receiver having an input node coupled to the input/output node of the simultaneous bi-directional port, the receiver including a first voltage sampling circuit coupled to the input/output node, a second voltage sampling circuit coupled to an output node of the replica driver, a subtraction circuit coupled between the first and second voltage sampling circuits, and a variable offset comparator coupled to be responsive to the subtraction circuit.

2. The simultaneous bi-directional port of claim 1 wherein the input/output node comprises a differential pair of nodes.

3. The simultaneous bi-directional port of claim 1 wherein the first voltage sampling circuit comprises at least one variable capacitor.

4. The simultaneous bi-directional port of claim 3 further comprising a control circuit coupled to control an offset of the variable offset comparator.

5. The simultaneous bi-directional port of claim 4 wherein the control circuit is coupled to control the at least one variable capacitor.

6. An integrated circuit comprising:
a driver circuit to drive a signal on a bi-directional line;
a replica driver circuit to drive a replica of the signal on an internal node;
a sampling circuit to sample a first voltage on the bi-directional line and a second voltage on the internal node;
a subtraction circuit to subtract the first voltage from the second voltage; and
a variable offset comparator having a signal input node coupled to be responsive to the subtraction circuit, and configured to have a voltage offset that varies in response to a digital control input.

7. The integrated circuit of claim 6 wherein the variable offset comparator comprises:
first and second differential transistor pairs coupled to the signal input node; and
first and second variable current generators coupled to the first and second differential transistor pairs, respectively, wherein the first and second variable current generators are coupled to be responsive to the digital control input.

8. The integrated circuit of claim 6 wherein the variable offset comparator comprises:
a voltage-to-current converter coupled between the signal input node and a current summing node; and
a digital-to-analog converter having a current output, the digital-to-analog converter coupled between the digital control input and the current summing node.

9. The integrated circuit of claim 6 wherein the sampling circuit comprises a variable capacitor to sample the first voltage on the bi-directional line.

10. The integrated circuit of claim 9 wherein the sampling circuit further comprises a second capacitor to sample the second voltage on the internal node.

11. The integrated circuit of claim 10 wherein the subtraction circuit comprises a switch coupled between the variable capacitor and the second capacitor.

12. An integrated circuit comprising:
a driver circuit to drive a pair of bi-directional lines;
a replica driver circuit to drive a pair of internal nodes;
a first sampling circuit to sample a first bi-directional line of the pair of bi-directional lines, and to sample a first node of the pair of internal nodes;
a second sampling circuit to sample a second bi-directional line of the pair of bi-directional lines, and to sample a second node of the pair of internal nodes;
a subtraction circuit to produce a differential output based on outputs of the first and second sampling circuits; and
a variable offset comparator to produce an output based on the differential output of the subtraction circuit in response to a digital control input.

13. The integrated circuit of claim 12 wherein at least one of the first and second sampling circuits includes:
a first capacitive device to sample one of the first and second bi-directional lines; and
a second capacitive device to sample one of the first and second internal nodes.

14. The integrated circuit of claim 13 further comprising:
a first switch coupled between the first capacitive device and one of the first and second bi-directional lines; and
a second switch coupled between the second capacitive device and one of the first and second internal nodes.

15. The integrated circuit of claim 14 wherein the subtraction circuit includes a switch coupled between the first capacitive device and the second capacitive device.

16. The integrated circuit of claim 13 wherein the first capacitive device includes a variable capacitor.

17. The integrated circuit of claim 13 wherein the variable offset comparator includes:
a first pair of differential transistors coupled to a pair of input nodes of the variable offset comparator, and a second pair of differential transistors coupled to the pair of input nodes; and
a first variable current generator coupled to the first pair of differential transistors, and a second variable current generator coupled to the second pair of differential transistors.

18. The integrated circuit of claim 13 wherein the variable offset comparator includes:
a voltage-to-current converter coupled between a pair of input nodes of the variable offset comparator and a pair of current summing nodes; and
a digital-to-analog converter having a current output, the digital-to-analog converter connecting between the digital control input and the pair of current summing nodes.

19. An integrated circuit comprising:
a first bi-directional line and a second bi-directional line;
a driver circuit to drive the first and second bi-directional lines;
a replica driver circuit to drive a first internal node and a second internal node;
a first sampling circuit to sample a voltage on the first bi-directional line and a voltage on the first internal node;
a second sampling circuit to sample a voltage on the second bi-directional line and a voltage on the second internal node;
a subtraction circuit to subtract the voltage on the first bi-directional line from the voltage on the first internal node, and to subtract the voltage on the second bi-directional line from the voltage on the second internal node; and
a variable offset comparator having input nodes coupled to be responsive to the subtraction circuit, and configured to have a voltage offset that varies in response to a digital control input.

20. The integrated circuit of claim 19 wherein at least one of the first and second sampling circuits includes:
a first capacitive device coupled to one of the first and second bi-directional lines; and
second capacitive device coupled to one of the first and second internal nodes.

21. The integrated circuit of claim 20 wherein the subtraction circuit includes a switch coupled between the first capacitive device and the second capacitive device.

22. The integrated circuit of claim 20 wherein the first capacitive device includes a variable capacitor.

23. The integrated circuit of claim 19 wherein the variable offset comparator includes:
   a first pair of differential transistors coupled to the input nodes, and a second pair of differential transistors coupled to the input nodes; and
   a first variable current generator coupled to the first pair of differential transistors, and a second variable current generator coupled to the second pair of differential transistors.

24. The integrated circuit of claim 19 wherein the variable offset comparator includes:
   a voltage-to-current converter coupled between the input nodes and a pair of current summing nodes; and
   a digital-to-analog converter having a current output, the digital-to-analog converter connecting between the digital control input and the pair of current summing nodes.

25. A method comprising:
   driving a pair of bi-directional lines;
   driving a pair of internal nodes;
   sampling input voltages on the pair of bi-directional lines;
   sampling output voltages on the pair of internal nodes;
   producing a first differential voltage from one of the input voltages and one of the output voltages;
   producing a second differential voltage from another one of the input voltages and another one of the output voltages; and
   producing a data based on the first differential voltage and the second differential voltage in response to a digital control input.

26. The method of claim 25 wherein sampling input voltages includes charging a first plurality of capacitive devices with the input voltages.

27. The method of claim 26 wherein sampling output voltages includes charging a second plurality of capacitive devices with the output voltages.

28. The method of claim 27 wherein producing each of the first differential signal and the second differential signal includes sharing a charge between a capacitive device of the first plurality of capacitive devices and a capacitive device of the second plurality of capacitive devices.

29. The method of claim 27 wherein producing a data includes amplifying a difference between the first differential voltage and the second differential voltage.

* * * * *